United States Patent [19]

Tsuno et al.

[11] Patent Number: 5,116,809
[45] Date of Patent: May 26, 1992

[54] OXIDE SERIES SUPERCONDUCTIVE SINTERED BODY AND METHOD OF PRODUCING THE SAME

[75] Inventors: Nobuo Tsuno, Kasugai; Keiji Matsuhiro, Nagoya; Hitoshi Sakai, Komaki, all of Japan

[73] Assignee: NGK Insulators, Ltd., Japan

[21] Appl. No.: 375,917

[22] Filed: Jul. 6, 1989

[30] Foreign Application Priority Data

Jul. 13, 1988 [JP] Japan ................ 63-172533

[51] Int. Cl.$^5$ ............................................. B32B 9/00
[52] U.S. Cl. ................................. 505/1; 505/701; 505/702; 505/703; 505/704; 428/457; 428/688; 428/698; 428/930
[58] Field of Search ............... 505/1, 701–704; 428/688, 698, 930, 457, 432, 433

[56] References Cited

U.S. PATENT DOCUMENTS 4,906,609 3/1990 Yamauchi et al. ............ 505/1

FOREIGN PATENT DOCUMENTS

| 2426032 | 12/1979 | France . |
| 63-250022 | 10/1988 | Japan . |
| 63-252319 | 10/1988 | Japan . |
| 63-264823 | 11/1988 | Japan . |
| 63-285813 | 11/1988 | Japan . |
| 63-285816 | 11/1988 | Japan . |
| 63-303813 | 12/1988 | Japan . |
| 64-10529 | 1/1989 | Japan . |
| 64-14819 | 1/1989 | Japan . |
| 64-27166 | 1/1989 | Japan . |
| 8802355 | 4/1988 | World Int. Prop. O. . |

OTHER PUBLICATIONS

CA 111(10): 82808s Saiaki et al.; Ninshio Steel Nov. 24, 1988.

Primary Examiner—Patrick J. Ryan
Attorney, Agent, or Firm—Parkhurst, Wendel & Rossi

[57] ABSTRACT

An excellent oxide series superconductive sintered body can be provided which can be joined to a metallic member easily and economically at low temperatures without causing peeling-off and deformation of the metallic member, cracks in the sintered body, and deterioration of the sintered body, by coating the surface of the sintered body with a coating metal. A method of producing the sintered body having the coating metal is also provided.

5 Claims, 2 Drawing Sheets

FIG_2
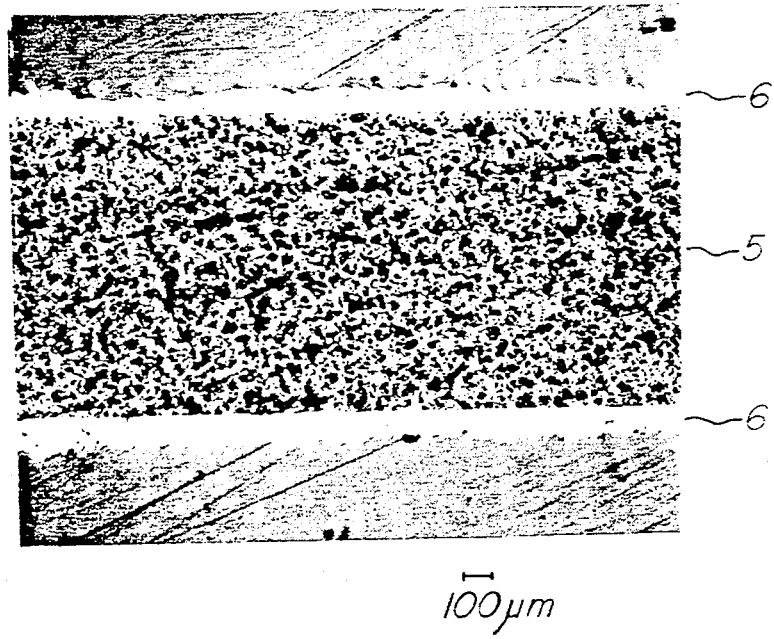
100μm 5,116,809

OXIDE SERIES SUPERCONDUCTIVE SINTERED BODY AND METHOD OF PRODUCING THE SAME

BACKGROUND OF THE INVENTION

1. Field of the Invention

The present invention relates to an oxide series superconductive sintered body, particularly an oxide series superconductive sintered body to be joined to a metallic member, and a method of producing the same.

2. Related Art Statement

Recently, in order to improve the mechanical strength of oxide series superconductors, oxide series superconductors have been earnestly desired to be used as joined bodies with metallic members.

Heretofore, as methods of joining an oxide series semiconductor and a metallic member, there are known (1) a method of plasma thermal spraying of an oxide series superconductor powder on a metallic plate, and heat treating the same at a temperature of 500° C. or higher; (2) a method of applying a solution of elements constituting a superconductor on a metallic plate, and sintering the same at a temperature of 800° C. or higher; and (3) a method of filling a superconductive oxide powder in a metallic tube, and sintering the same at a temperature of 800° C. or higher.

The above methods can obtain joined bodies of a metallic member and a superconductive oxide of yttrium-barium-copper oxide, rare earth-barium-copper oxide wherein a portion or the whole of yttrium is substituted by other rare earth elements (except for Sc, Tb), bismuth-calcium-strontium-copper oxide with optional lead oxide, or thallim-barium-calcium-copper oxide. However, all the methods have drawbacks of necessitating high temperatures for the sintering or the heat treatment in obtaining the joined body of the superconductive oxide and the metallic member.

If a metal, such as aluminum, or copper, etc., is used as the metallic member for producing the joined body, various problems occur in that a superconductive oxide is reacted with the metallic member at such high treating or sintering temperatures to deteriorate its superconductive property, and the metallic member is oxidized by an oxidative atmosphere. If silver or a like metal that does not react with a superconductive oxide is used as the metallic member to be joined with the superconductive oxide, the cost is considerably increased, though the above problems are prevented.

Even if silver is used as the metallic member to be joined with a superconductive oxide, there are drawbacks in that, if the temperature of the joined body is decreased from a high temperature of 900° C. or higher to room temperature, silver and the superconductive oxide are peeled from each other, or a crack occurs in the superconductive oxide, due to a difference in thermal expansion coefficients between the superconductive oxide and silver.

The above methods (1) of plasma thermal spray and (2) of application of a solution can not precisely control the composition of the sprayed superconductive oxide or densify the superconductive oxide, so that the superconductive property of the joined bodies are difficult to improve. While, the above method (3) of filling a superconductive oxide powder in a metallic tube has a drawback in that a superconductive oxide which necessitates a heat treatment for absorbing oxygen, such as yttrium-barium-copper oxide, is prevented from absorbing oxygen by the metallic tube.

SUMMARY OF THE INVENTION

An object of the present invention is to obviate the above problems and drawbacks.

Another object of the present invention is to provide an oxide series superconductive sintered body capable of obtaining joined bodies which do not show deterioration of the superconductive property nor peeling-off at the interface between the superconductive oxide and the metallic member.

Another object of the present invention is to provide a method of producing the oxide series superconductive sintered body.

The present invention is an oxide series superconductive sintered body, comprising a metal coating layer on the front and/or the rear surface.

In the first aspect of the method of producing the oxide series superconductive sintered body of the present invention, the front and/or the rear surface of the oxide series superconductive sintered body of a desired shape is coated with a metal.

In the second aspect of the method of producing the oxide series superconductive sintered body of the present invention, the oxide series superconductive sintered body having the metal coating on the surface is wrapped by a cast metal.

In the present invention, an oxide series superconductive sintered body of superior superconductive property is prepared, and then thermal sprayed by arc thermal spray or plasma thermal spray, etc., on its surface with a metal, such as aluminum, aluminum alloy, copper, lead, etc., to form a coating metal layer, preferably of a thickness of 20–200 μm, so that the surface of the oxide series superconductive sintered body can be coated with the metal without necessitating a high temperature of exceeding 200° C. for treating the superconductive sintered body.

Yttrium-barium-copper oxides release oxygen at 350° C. or higher, so that the superconductive property thereof is deteriorated. Also, bismuth-calcium-strontium-copper-oxides react with a metal at 400°–500° C. or higher, so that the superconductive property thereof is deteriorated. However, in the present invention, an oxide series superconductive sintered body can be coated with a metal at the surface at a treating temperature of not over than 200° C., so that the superconductive property thereof is not deteriorated and the superconductive body shows a good coherent adhesivity to the coating metal.

Fundamentally any metal can be used as the coating metal though the coating metal is restricted to those capable of arc melting in the arc thermal spray and preventing an excessive increase of the temperature of the superconductive body during the plasma thermal spray. From the viewpoint of cost, aluminum, aluminum alloys, copper, lead, etc., are useful in the arc thermal spray. Heat resistant metals, such as Mo, Zr, W, etc., are also useful in the plasma thermal spray.

The coating metal can be applied on the superconductive body to an any desired thickness, experimentally. However, the thickness is preferably 20–200 μm, particularly 50–150 μm. If the thickness is less than 20 μm, the superconductive body is not protected sufficiently from the outer atmosphere and the coating metal of such thin thickness is not effective as a reinforcing member for the mechanical strength of the oxide series superconductive sintered body. If the thickness exceeds 200 μm, a thermal gradient is formed in the coating metal layer during the thermal spray or undesirable phenomena occur that the superconductive sintered body of thin thickness is warped and the superconductive sintered body is damaged during the cooling due to the difference of thermal expansion coefficients between the superconductive sintered body and the coating metal.

The occurrence of such warpage or damage of the superconductive sintered body can be prevented by simultaneous thermal spraying the coating metal on both surfaces of the superconductive sintered body of small thickness or alternate thermal spraying of the coating metal on either surface of the superconductive sintered body to a thickness of not exceeding 100 μm per one time.

Yttrium-barium-copper oxide is dissolved noticeably in an aqueous solution to deteriorate the superconductive property thereof. Also, bismuth-calcium-strontium-copper oxide and thallium-barium-calcium-copper oxides are dissolved a little in an aqueous solution to deteriorate the superconductive property thereof. However, the oxide series superconductive sintered body coated by the coating metal layer at the surface is not dissolved in an aqueous solution when immersed therein, so that the superconductive property thereof is not deteriorated. Similarly, the superconductive property of the oxide series superconductive sintered body is not deteriorated even when immersed in an electric plating solution or an electroless plating solution, so that an additional coating metal layer or layers of a same or different kind of metal can be applied on the coating metal layer to form a further thick coating metal layer by an electric plating or an electroless plating.

The oxide series superconductive body of the present invention can be joined to a metallic member, such as a metal plate, by means of welding, spot welding, brazing, soldering, bonding, etc., by using the coating metal layer on the surface.

Usually, when an oxide series superconductive sintered body is composited with a metallic member by wrapping the oxide series superconductive sintered body by a cast metal, a molten metal and the oxide series superconductive sintered body are directly contacted, so that they react with each other, hence the superconductive property of the oxide series superconductive sintered body is deteriorated. However, in the present invention, the oxide series superconductive sintered body has a coating metal layer on the surface, so that it can be wrapped by a cast metal without the direct reaction of the superconductive body and the cast metal.

BRIEF DESCRIPTION OF THE DRAWINGS

For a better understanding of the present invention, reference is made to the accompanying drawings, in which:

FIG. 2 is an enlarged photograph of a grainy structure at a cross-section of a thin plate of an oxide series superconductive sintered body consisting of $YB_{a2}Cu_3O_{7-\delta}$ coated by aluminum;

Figure 1:
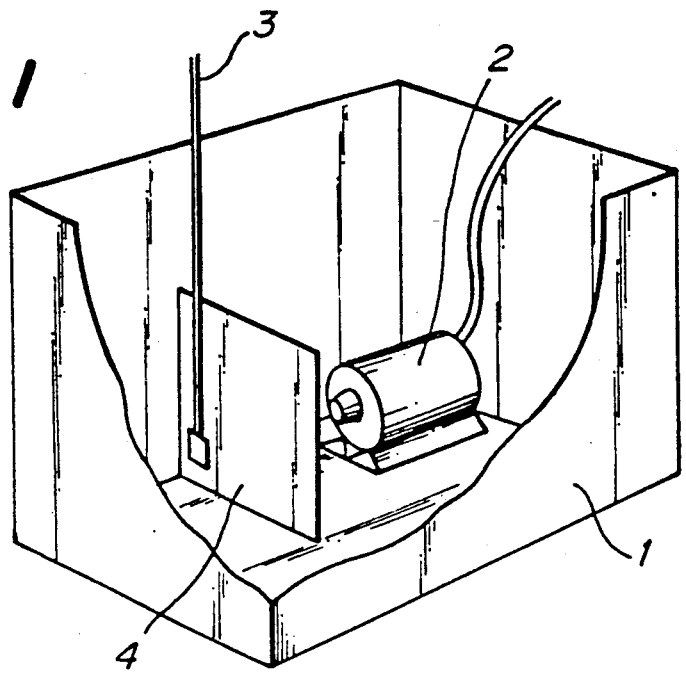
FIG. 1 is a schematic perspective view of a structure of an example of an apparatus for measuring a magnetic shielding functional ability.

Numberings in the drawings.
1 ... vessel for liquid nitrogen
2 ... electromagnet
3 ... Gauss meter
4 ... sample
5 ... thin plate of oxide series superconductive sintered body consisting of $YB_{a2}Cu_3O_{7-\delta}$
6 ... coating aluminum layer
7 ... mold
8 ... sample of superconductor
9 ... crucible
10 ... holding furnace
11 ... conduit
12 ... molten aluminum alloy
13 ... gas inlet pipe
14 ... gate Hereinafter, the explanations will be made in more detail with reference to examples.

EXAMPLE 1

By a tape forming process, thin plates of an oxide series superconductive sintered body consisting of $YB_{a2}Cu_3O_{7-\delta}$ of a size of $100 \times 100 \times 1.0$ mm, are prepared. The sintered body has a density of 85%, an electric resistance of 0 at 92K or less, and Meissner effect under observation, so that the sintered body is ascertained as a superconductive body at higher temperatures. Thereafter, the thus obtained sintered body is measured on magnetic shielding functional ability.

The apparatus for measuring the magnetic shielding functional ability, comprises a vessel 1 for liquid nitrogen, an electromagnet 2, and a Gauss meter (a device for measuring a magnetic flux density) 3, and is used for measuring a leakage magnetic field by inserting a sample 4 of a superconductor between the electromagnet 2 and the Gauss meter 3, and generating a constant magnetic field by the electromagnet 2 in the presence of liquid nitrogen, and measuring the leakage magnetic field by the Gauss meter 3.

A test sample 4 is inserted between the electromagnet 2 and the Gauss meter 3, and then a maximum applicable or permissible magnetic field is measured that can permit a perfect shield of magnetic field of a leakage magnetic field of not exceeding 0.01 Gauss. At this time, the perfect shielding functional ability is 17 Gauss.

The thin plate of the sintered body is coated with aluminum by an arc thermal spray. The arc thermal spray is carried out into effect by disposing two aluminum wires of 1.6 mmϕ at a close distance, applying an electric current across the aluminum wires to generate an arc, melting the aluminum wires by heat of the generated arc, and thermal spraying the melted aluminum on the thin plates of the oxide series superconductive sintered body by a pressurized air. The thermal spray is effected by two or three times of scanning in a range of 100 mm × 100 mm to form an aluminum layer of a thickness of 100 μm on the whole one surface front surface) of the oxide series superconductive sintered body.

In the same manner as in the case of the front surface, the rear side of the sintered body is also coated with aluminum to a thickness of 100 μm. A photograph of a cross-section of the thermal sprayed sintered body is shown in FIG. 2. As seen from FIG. 2, aluminum coating layers 6 are present on the both surfaces of the thin plate of the oxide series superconductive sintered body 5 consisting of $YB_{a2}Cu_3O_{7-\delta}$. Because the sintered body 5 has a thickness of 1 mm, the marginal edge portions of the surface of the sintered body 5 are coated to a substantially same thickness as in the central portion of the surfaces of the sintered body 5, so that the whole surfaces of the sintered body 5 is coated and sealed by aluminum. During the thermal spray, the temperature of the sintered body 5 is around 50° C., and deformation or warp of the sintered body is not observed after the thermal spray. The thermal sprayed sintered body 5 is measured on the superconductive property and the magnetic shielding functional ability using the apparatus as shown in FIG. 1 in the same manner as performed before the thermal spray, to find out that no deterioration occurred by the thermal spray.

In order to test the sealing property of the aluminum coating, sintered bodies coated with aluminum and not coated with aluminum are held in water at 50° C. for 3 days. After the holding, the sintered bodies are measured on the superconductive property in the same manner as described above. As a result, the sintered body not coated with aluminum lost the superconductive property completely by deterioration, while the sintered body coated with aluminum does not show deterioration of the superconductive property and the magnetic shielding functional ability.

In order to test the coherent adhesive property of the aluminum coating, the sintered body coated with aluminum is immersed in liquid nitrogen for a few minutes and taken out to room temperature, and this treatment is repeated for 20 times to find out that no peeling off of the aluminum coating from the sintered body occurs.

In order to test the strength, samples of the sintered body are prepared by cutting out plates of a size of 20 mm × 50 mm × 1 mm from the sintered body, and coating or not coating the both surfaces of the plates with aluminum. Bend strength of the samples is measured at 30° C. on a span of 30 mm length supported at three points. The sample not coated with aluminum has an average strength of 40 MPa for five test pieces, while the sample coated with aluminum has an average strength of 110 MPa for five test pieces.

EXAMPLE 2

The thin plates of the oxide series superconductive sintered body consisting of $YB_{a2}Cu_3O_{7-\delta}$ same as that used in Example 1 are coated with zirconium by plasma thermal spray. For the thermal spray a spray gun is swung one or two times in a range of 100 mm × 100 mm to coat the whole front surface of the sintered body with zirconium of a thickness of 60 μm. The rear surface of the sintered body is also coated with 60 μm thickness of zirconium in the same manner as in the case of the front surface of the sintered body. During the thermal spray, the rate of thermal spray is controlled so that the temperature of the sample of the sintered body does not arise above 200° C. After the thermal spray, deformation and warp of the sintered body are not observed. The sample thin plates are measured on the superconductive property and the magnetic shielding functional ability in the same manner as in Example 1 to find out that no deterioration due to the thermal spray occurred.

EXAMPLE 3

The thin plates of the oxide series superconductive sintered body consisting of $YB_{a2}Cu_3O_{7-\delta}$ coated with aluminum produced by Example 1, is coated with copper of 20 μm thickness by electroplating. In order to examine an influence of the electroplating treatment over the superconductive property of the sintered body, the electroplate sintered body is measured on the superconductive property and the magnetic shielding functional ability in the same manner as in Example 1, to find out that no deterioration of the superconductive property and the magnetic shielding functional ability occurs by the electroplating.

EXAMPLE 4

Figure 3:
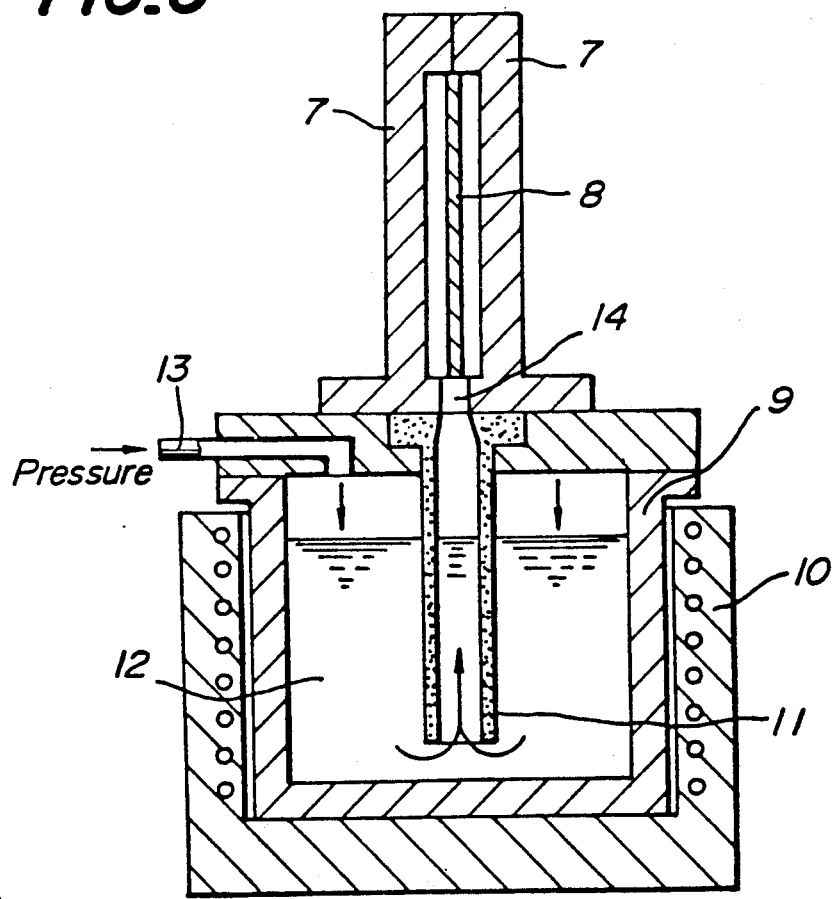
FIG. 3 is a schematic cross-sectional view of a structure of an example of a casting apparatus for wrapping the both surfaces of an oxide series superconductive ceramics plate having coating metal layers on the both surfaces by a cast metal.

The thin plate of the oxide series superconductive sintered body consisting of $YB_{a2}Cu_3O_{7-\delta}$ and coated with aluminum produced by Example 1, is coated on the outer surface with a cast aluminum alloy of a thickness of 1.5 mm in the following way. A schematic view of the apparatus used for the coating is shown in FIG. 3.

At first, a sample 8 prepared by coating an aluminum layer on the surface of the oxide series superconductive sintered body is positioned in a mold 7, and then the mold 7 is attached on a crucible 9 holding a molten aluminum alloy (JIS-AC8A). After the molten aluminum alloy is adjusted to a desired temperature, argon gas is introduced in the crucible 9 through a gas inlet pipe 13 to exert a pressure of about 0.1–0.5 kg/cm$^2$ on the liquid surface of the molten metal so as to cast a molten aluminum alloy 12 in the mold 7 through a conduit 11. The exertion of the pressure on the molten aluminum alloy by the argon gas is continued until the cast molten metal in the mold 7 is gradually solidified from the most remote portion to the near portion of the gate and upto the gate portion. As soon as the solidification of the molten alloy begins at the gate of the mold, the introduction of the argon gas in the crucible 9 is stopped to finish the pressurizing, and an unsolidified molten metal existing in the conduit 11 below the gate is dropped in the crucible 9 by gravity.

After the temperature of mold 7 is decreased to a releasable temperature at which the molded article can be released from the mold, the sintered body wrapped by the cast metal or the cast wrapped body is taken out of the mold 7.

The cast wrapped body is tested on by X-ray fluoroscopy to examine an occurrence of cracks in the oxide series superconductive sintered body. No crack was observed in the cast wrapped body. The cast wrapped body is measured on the superconductive property and the magnetic shielding functional ability in the same manner as in Example 1 to find out that no deterioration occurred.

As apparent from the foregoing explanations, according to the oxide series superconductive sintered body and the method of producing the same of the present invention, the oxide series superconductive sintered body is coated by a metal by thermal spray, so that an excellent joined body of the oxide series superconductive sintered body and a metallic member can be obtained having no deterioration of the superconductive property, no peeling off at the interface between the superconductive sintered body and the joined metallic member, and a superior coherent adherent property between the superconductive sintered body and the joined metallic member.

The oxide series superconductive sintered body having a coating metal layer on the surface according to the present invention uses the coating metal layer as a reinforcing member for the sintered body, so that the mechanical strength of the sintered body can be improved exceedingly, the reaction of the sintered body with a moisture content can be intercepted, a joining thereof with a metallic plate, etc., can be facilitated, and a layer for mitigating a thermal shock in case of placing it in or out of liquid nitrogen can be attached easily without considering a reaction of the mitigating layer with the sintered body.

The oxide series superconductive sintered body having a coating metal layer of the present invention is extremely suitable as a magnetic shielding plate or the like uses, because of the above mentioned characteristic property.

Therefore, the present invention is eminently useful industrially.

Although the present invention has been explained with specific examples and numerical values, it is of course apparent to those skilled in the art that various changes and modifications thereof are possible without departing from the broad spirit and aspect of the present invention as defined in the appended claims.

What is claimed is:

1. A high Tc superconductive composite sintered body, comprising a high Tc superconductive sintered body and a coating metal layer on a surface thereof, said coating metal layer having a thickness of about 20-200 µm, said coating metal layer comprising at least one metal selected from the group consisting of aluminum, aluminum alloy, copper, lead, molybdenum, zirconium, and tungsten, and said coating metal layer being applied to the surface of said sintered body at a temperature below about 200° C.;

wherein the superconductive property and the magnetic shielding functional ability of said high Tc superconductive composite sintered body is substantially equal to the superconductive property and the magnetic shielding functional ability to said high Tc superconductive sintered body.

2. The high Tc superconductive sintered body of claim 1, wherein the coating metal layer has a thickness of 50-150 µm.

3. The high Tc superconductive sintered body of claim 1, wherein the coating metal layer comprises at least one metal selected from the group consisting of aluminum, aluminum alloy, copper, and lead.

4. The high Tc superconductive sintered body of claim 3, wherein the coating metal layer comprises at least one metal selected from the group consisting of aluminum and aluminum alloy.

5. The high Tc superconductive sintered body of claim 1, wherein the coating metal layer comprises at least one metal selected from the group consisting of Mo, Zr, and W.

* * * * *